(12) United States Patent
Uchida et al.

(10) Patent No.: US 9,974,196 B2
(45) Date of Patent: May 15, 2018

(54) ELECTRONIC DEVICE

(71) Applicant: DENSO CORPORATION, Kariya, Aichi-pref. (JP)

(72) Inventors: Takuma Uchida, Kariya (JP); Takamitsu Kubota, Kariya (JP); Yoshiyuki Kono, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/368,747

(22) Filed: Dec. 5, 2016

(65) Prior Publication Data
US 2017/0164492 A1    Jun. 8, 2017

(30) Foreign Application Priority Data
Dec. 7, 2015 (JP) ................. 2015-238372

(51) Int. Cl.
| | |
|---|---|
| *H05K 5/00* | (2006.01) |
| *H01R 12/57* | (2011.01) |
| *H01R 12/70* | (2011.01) |
| *F02D 9/10* | (2006.01) |
| *F02D 11/10* | (2006.01) |
| *F16K 31/04* | (2006.01) |
| *H01R 4/04* | (2006.01) |
| *H01R 12/72* | (2011.01) |

(52) U.S. Cl.
CPC ........... *H05K 5/0069* (2013.01); *F02D 9/105* (2013.01); *F02D 11/106* (2013.01); *F16K 31/04* (2013.01); *H01R 4/04* (2013.01); *H01R 12/57* (2013.01); *H01R 12/7005* (2013.01); *F02D 2400/18* (2013.01); *H01R 12/728* (2013.01)

(58) Field of Classification Search
CPC .. H05K 5/0069; H01R 12/57; H01R 12/7005; H01R 4/04; H01R 12/728; F02D 9/105; F02D 11/106; F02D 2400/18; F16K 31/04
USPC ......................................................... 361/752
See application file for complete search history.

(56) References Cited

U.S. PATENT DOCUMENTS

| | | | | |
|---|---|---|---|---|
| 4,914,954 A | * | 4/1990 | Zlamal .................... | F02D 41/00 73/431 |
| 6,407,543 B1 | * | 6/2002 | Hagio .................... | B60K 37/02 123/617 |
| 2001/0017766 A1 | * | 8/2001 | Murowaki ............. | H05K 1/147 361/752 |
| 2004/0066602 A1 | * | 4/2004 | Kamiya ............... | H05K 5/0069 361/302 |
| 2004/0231644 A1 | * | 11/2004 | Ikeda ........................ | F02D 9/02 123/399 |
| 2014/0300832 A1 | * | 10/2014 | de Jong .................. | G06F 3/041 349/12 |

(Continued)

FOREIGN PATENT DOCUMENTS

JP        2012-247279 A    12/2012

*Primary Examiner* — Sherman Ng

(57) ABSTRACT

The present disclosure provides an electronic device including a casing, a terminal, a substrate, an electric connector, and a conductive adhesive. The terminal is fixed to the casing. The substrate is attached to the casing at a position where at least a portion of the substrate faces the terminal. The electric connector is fixed to a circuit wiring formed in the substrate at a position where the substrate faces the terminal. The electric connector protrudes toward the terminal from the circuit wiring. The conductive adhesive electrically and mechanically connects the terminal to the electric connector.

7 Claims, 5 Drawing Sheets

(56) References Cited

U.S. PATENT DOCUMENTS

2014/0368283 A1* 12/2014 Shimodaira ............. H03L 1/028
                                                     331/70
2015/0198101 A1*  7/2015 Nishimoto ............. F02D 9/105
                                                     123/350

* cited by examiner

ELECTRONIC DEVICE

CROSS REFERENCE TO RELATED APPLICATION

This application is based on reference Japanese Patent Application No. 2015-238372 filed on Dec. 7, 2015, the disclosure of which is incorporated herein by reference.

TECHNICAL FIELD

The present disclosure relates to an electronic device.

BACKGROUND

Conventionally, an electronic device that detects a rotational angle of a throttle valve of an electronic control throttle has been known.

An electronic device disclosed in JP 2012-247279 A includes a sensor cover of an electronic control throttle and a substrate disposed in the sensor cover. A connecting terminal extending from a connector is fixed to the sensor cover. In the substrate, an electronic circuit is formed to detect a rotational angle of the throttle valve. The connecting terminal fixed to the sensor cover and a circuit wiring formed in the substrate are electrically connected to each other through a wiring member having a waveform.

However, the electronic device disclosed in JP 2012-247279 A may bring following concerns due to usage of the wiring member that connects the connecting terminal fixed to the second cover to the circuit wiring formed in the substrate.

First, the number of components increases by using the wiring member, the configuration of the electronic device becomes complicated, and the size of the electronic device is increased. Second, since the wiring member has a waveform, the manufacturing process becomes complicated. Third, a step for connecting the circuit wiring of the substrate to the wiring member and a step for connecting the connecting terminal to the wiring member are required, which result in increasing the number of manufacturing steps. Because of the above first to third concerns, manufacturing cost may be increased.

In view of the above, it is an objective of the present disclosure to provide an electronic device having a simplified configuration.

SUMMARY

An aspect of the present disclosure provides an electronic device including a casing, a terminal, a substrate, an electric connector, and a conductive adhesive. The terminal is fixed to the casing. The substrate is attached to the casing at a position where at least a portion of the substrate faces the terminal. The electric connector is fixed to a circuit wiring formed in the substrate at a position where the substrate faces the terminal. The electric connector protrudes toward the terminal from the circuit wiring. The conductive adhesive electrically and mechanically connects the terminal to the electric connector.

Therefore, the terminal fixed to the casing and the circuit wiring of the substrate are electrically and mechanically connected to each other by the conductive adhesive. Thus, there is no need for the electronic device to use a wiring member to connect a terminal fixed to the casing to the circuit wiring of the substrate, thereby reducing the number of components, simplifying its configuration, and downsizing the electronic device. Furthermore, the step for attaching the substrate to the casing and the step for connecting the terminal fixed to the casing to the circuit wiring of the substrate can be performed at the same time. Thus, manufacturing cost for the electronic device can be reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

Next, a plurality of embodiments of the present disclosure will be described with reference to drawings.

First Embodiment

Figure 1:
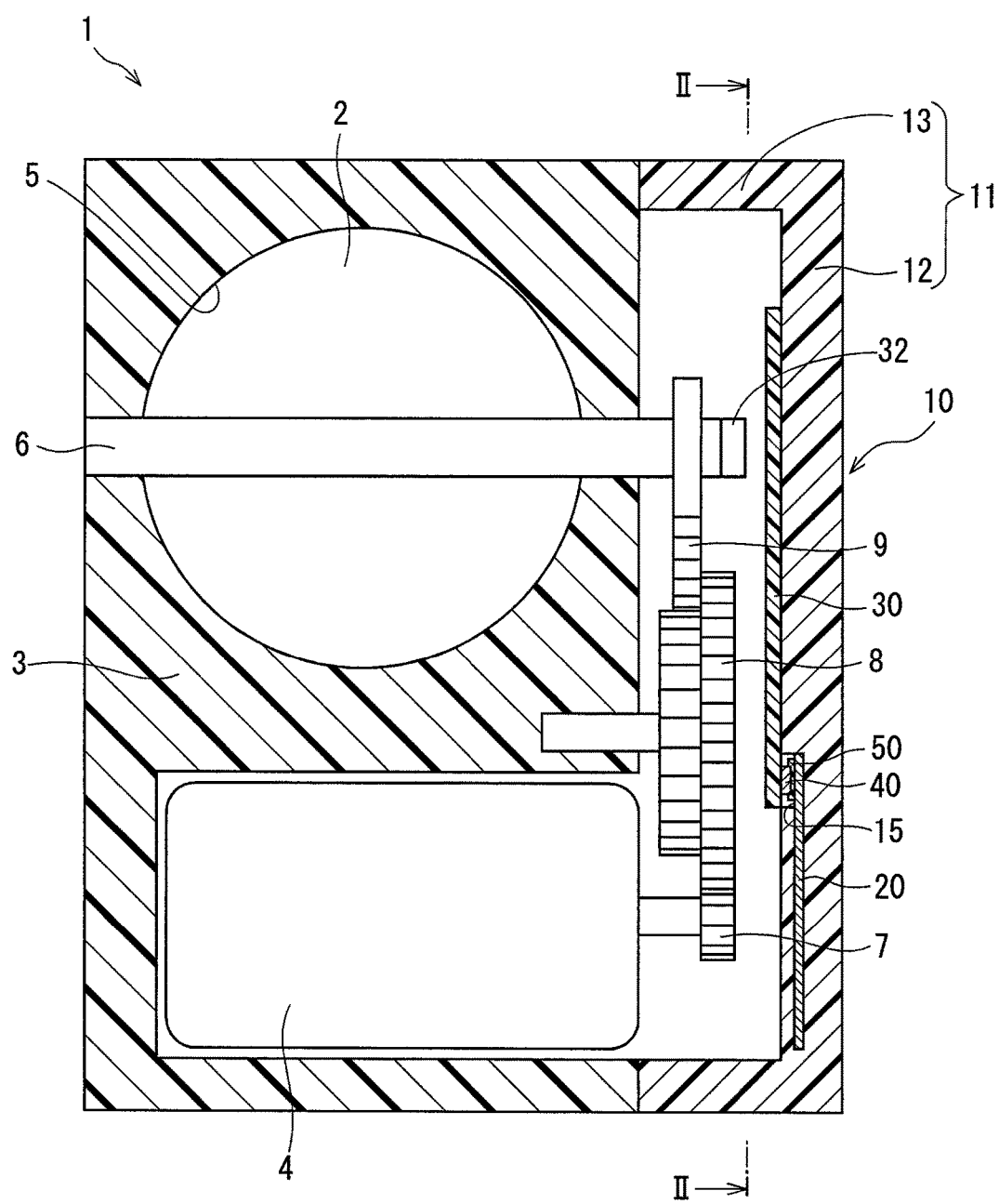
FIG. 1 is a cross-sectional diagram of an electronic control throttle having an electronic device according to a first embodiment.
Figure 2:
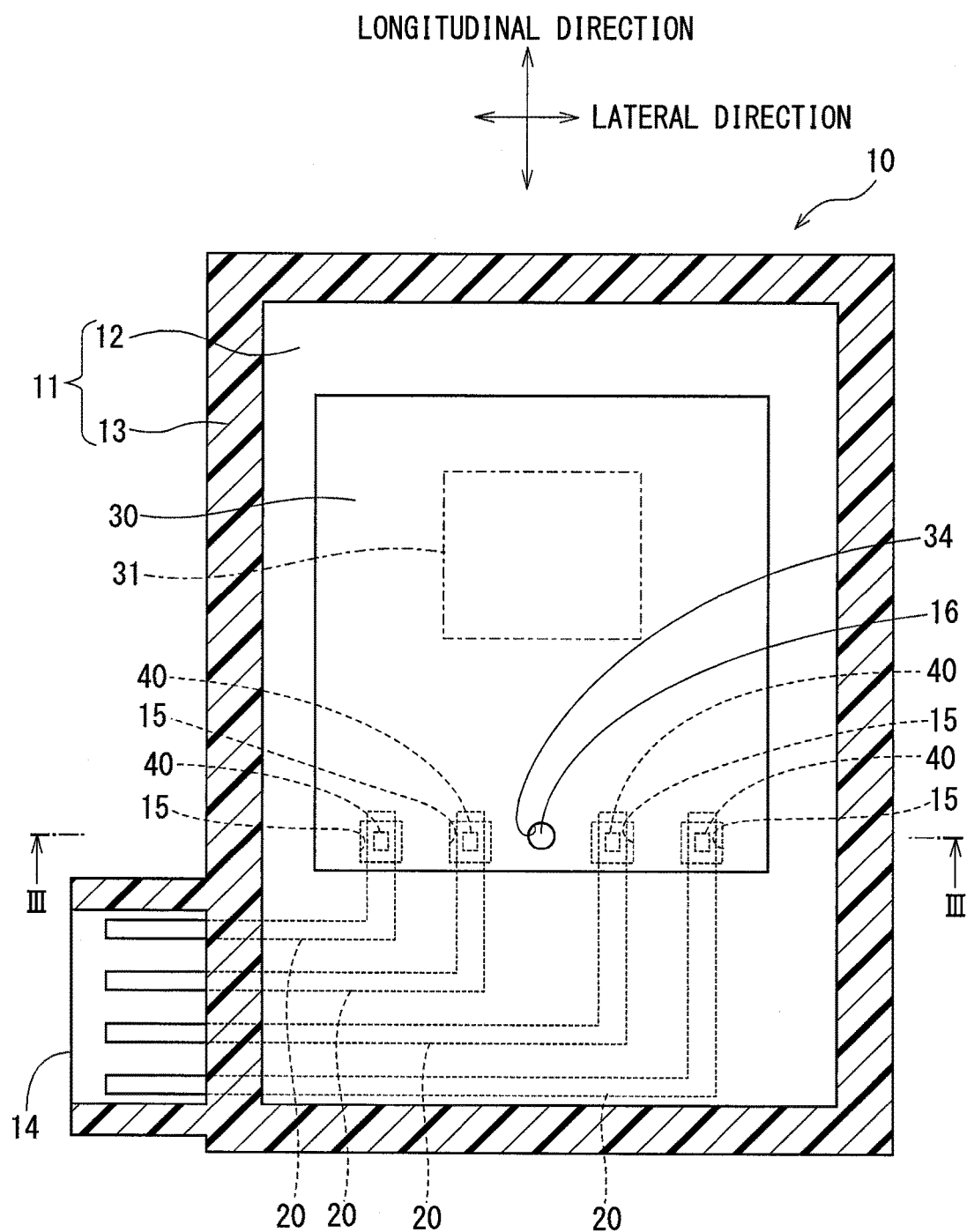
FIG. 2 is a cross-sectional diagram taken along II-II line in FIG. 1.
Figure 3:
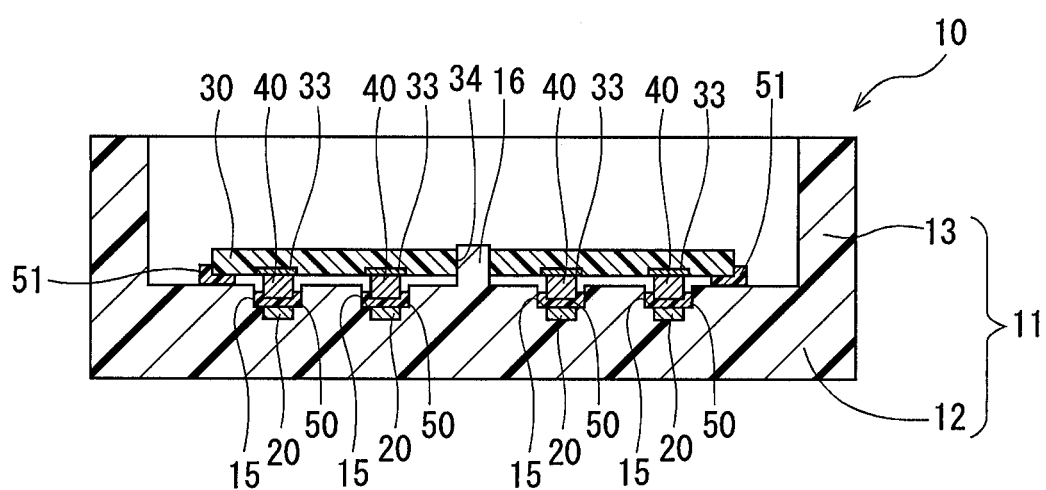
FIG. 3 is a cross-sectional diagram taken along III-III line in FIG. 2.

FIGS. 1 to 3 show the first embodiment of the present disclosure. An electronic device 10 of the first embodiment is used for detecting a rotational angle of a throttle valve 2 of an electronic control throttle 1.

A configuration of the electronic control throttle 1 will be described first.

As shown in FIG. 1, the electronic control throttle 1 includes the throttle valve 2, a passage member 3, a motor 4, the electronic device 10, and so on.

An intake passage 5 to draw an air into an engine is defined inside the passage member 3. The throttle valve 2 is substantially disc-shaped and is disposed inside the intake passage 5. The throttle valve 2 is fixed to a shaft 6 and the shaft 6 has side ends that are rotatably supported by the passage member 3. As a result, the throttle valve 2 is rotatable about the center of the shaft 6 as a rotational axis.

The motor 4 is controlled by commands from an electronic control unit (ECU) of the engine (not shown). Torque of the motor 4 is transmitted to the throttle valve 2 through a plurality of gears 7, 8, 9. An amount of the intake air to be supplied to the engine is adjusted by controlling valve opening of the throttle valve 2.

Next, the electronic device 10 of the electronic control throttle 1 will be described.

As shown in FIGS. 1 to 3, the electronic device 10 includes a sensor cover 11, a plurality of terminals 20, a substrate 30, a plurality of electronic connectors 40, a plurality of conductive adhesives 50, and so on. The cover sensor 11 may serve as a "casing" of the present disclosure.

The sensor cover 11 is made of, for example, a plastic, and is formed into a disc shape. The sensor cover 11 includes a cover 12 and a circumferential portion 13 that extends toward the passage member 3 from an outer circumferential edge of the cover 12. The sensor cover 11 is fixed to the passage member 13 by a bolt (not shown). As shown in FIG. 2, the sensor cover 11 has a shape extending both a longitudinal direction and a lateral direction. The sensor cover 11 fixes the plurality of terminals 20 by resin-molding. On end of each terminal 20 extends to an inside of a connector 14 that is disposed on an outer wall of the sensor cover 11, and the other end of each terminal 20 extends to reach a respective bottom of a plurality of recessed portions 15 formed in the sensor cover 11. The plurality of recessed portions 15 of the sensor cover 11 are located to face the substrate 30.

The substrate 30 is attached to the sensor cover 11 so that at least a portion of the substrate 30 is overlapped with the recessed portions 15 of the sensor cover 11. In other words, at least portion of the substrate 30 faces the terminals 20 that extend to the bottoms of the recessed portions 15 of the sensor cover 11. The substrate 30 is fixed to the sensor cover 11 by adhesives 51 (see FIG. 3).

A detecting circuit 31 capable of detecting a magnetic field is formed in the substrate 30. The detecting circuit 31 detects a magnetic field of a magnet 32 fixed to one end of the shaft 6. Output signals from the detecting circuit 31 are transmitted to the ECU through the terminals 20 that are connected to circuit wirings 33 of the substrate 30. The ECU detects a rotational angle of the throttle valve 2 based on the outputs signals of the detecting circuit 31 and controls operation of the motor 4.

A portion of each of the circuit wirings 33 is disposed in one surface of the substrate 30 at a position where the portions of the circuit wirings 33 face the terminals 20 that extend to the bottoms of the recessed portions 15 (see FIG. 3). A plurality of electric connectors 40, each of which is made of, e.g., a metallic chip, are fixed to the circuit wirings 33 by welding or soldering. Each of the plurality of electric connectors 40 corresponds to a respective one of the plurality of terminals 20. Each electric connector 40 protrudes from the circuit wiring 33 of the substrate 30 toward the corresponding terminal 20 that extends to the bottom of the recessed portion 15.

Each terminal 20 and the corresponding electric connector 40 are electrically and mechanically connected to each other by the conductive adhesive 50.

The sensor cover 11 and the substrate 30 are made of different materials from each other. Thus, if a temperature of the electronic device 10 changes, there is concern that a stress would be applied to the conductive adhesives 50, each of which connects the terminal 20 fixed to the sensor cover 11 to the electric connector 40 fixed to the circuit wiring 33 of the substrate 30, due to a difference of the linear expansion coefficient between the sensor cover 11 and the substrate 30.

In view of the above, the electronic device 10 of the present embodiment includes a substrate positioning pin 16. The substrate positioning pins 16 is positioned between two of the plurality of electric connectors 40 that are immediately adjacent to each other. The substrate positioning pin 16 is integrally formed with the sensor cover 11 and extends from the sensor cover 11 to be fit into a substrate hole 34 defined in the substrate 30. Therefore, each of the sensor cover 11 and the substrate 30 increases its volume through thermal expansion and decreases its volume through thermal contraction with respect to the substrate positioning pin 16. As a result, a stress applied to the conductive adhesives 50 is reduced. Accordingly, reliability of electric connection by the conductive adhesives 50 can be enhanced according to the electronic device 10.

Next, a method for fixing the substrate 30 to the sensor cover 11 will be described.

In this method, the adhesives 51 are applied to the sensor cover 11 at positions where the substrate 30 is attached to the sensor cover 11, or to an outer circumference of the substrate 30. Further, the conductive adhesives 50 are applied to the terminals 20 in the recessed portions 15 of the sensor cover 11, or the plurality of electric connectors 40 disposed in the substrate 30.

Then, the substrate 30 and the sensor cover 11 are coupled to each other, and fixed by the adhesives 51. At this point, the substrate positioning pin 16 extending from the sensor cover 11 is inserted into the substrate hole 34 of the substrate 30. At the same time, the terminals 20 in the recessed portions 15 of the sensor cover 11 and the plurality of electric connectors 40 disposed in the substrate 30 are fixed to each other by the conductive adhesives 50. As a result, the substrate 30 is fixed to the sensor cover 11, while the circuit wirings 33 of the substrate 30 and the terminals 20 are electrically and mechanically connected to each other.

According to the electronic device 10 of the present disclosure, following operation and effects are obtained.

In the present embodiment, the terminals 20 fixed to the sensor cover 11 and the circuit wirings 33 of the substrate 30 are electrically and mechanically connected to each other by the conductive adhesives 50. Thus, there is no need to use wiring members to connect the terminals 20 to the circuit wirings 33 of the substrate 30, thereby reducing the number of components, simplifying the configuration, and downsizing the electronic device 10. Furthermore, the step for attaching the substrate 30 to the sensor cover 11 and the step for connecting the terminals 20 fixed to the sensor cover 11 to the circuit wirings 33 of the substrate 30 can be performed at the same time. Thus, manufacturing cost for the electronic device 10 can be reduced.

In the present embodiment, the sensor cover 11 includes the recessed portions 15 at the positions where the terminals 20 and the electric connectors 40 are connected to each other. The terminals 20 fixed to the sensor cover 11 extend to the bottoms of the recessed portions 15 of the sensor cover 11. The electric connectors 40 protrude into the recessed portions 15 from the circuit wirings 33 of the substrate 30.

Therefore, release of the conductive adhesives 50 from an inside of the recessed portions 15 of the sensor cover 11 to an outside of thereof. Hence, a short between the neighboring two electric connectors 40 through the conductive adhesives 50 can be prevented.

In the present embodiment, the substrate 30 is fixed to the sensor cover 11 by the adhesives 51.

Thus, a space between the substrate 30 and the sensor cover 11 can be narrowed, thereby downsizing the electronic device 10.

In the present embodiment, the electronic device 10 includes the substrate positioning pin 16, which extends from the sensor cover 11 to be fit into the substrate hole 34, between the two neighboring electric connectors 40.

Accordingly, each of the sensor cover 11 and the substrate 30 increases and decreases the volume thereof through thermal expansion and thermal contraction with respect to the substrate positioning pin 16, thereby reducing stress applied to the conductive adhesives 50. Therefore, reliability of electric connection by the conductive adhesives 50 can be enhanced.

Second Embodiment

Figure 4:
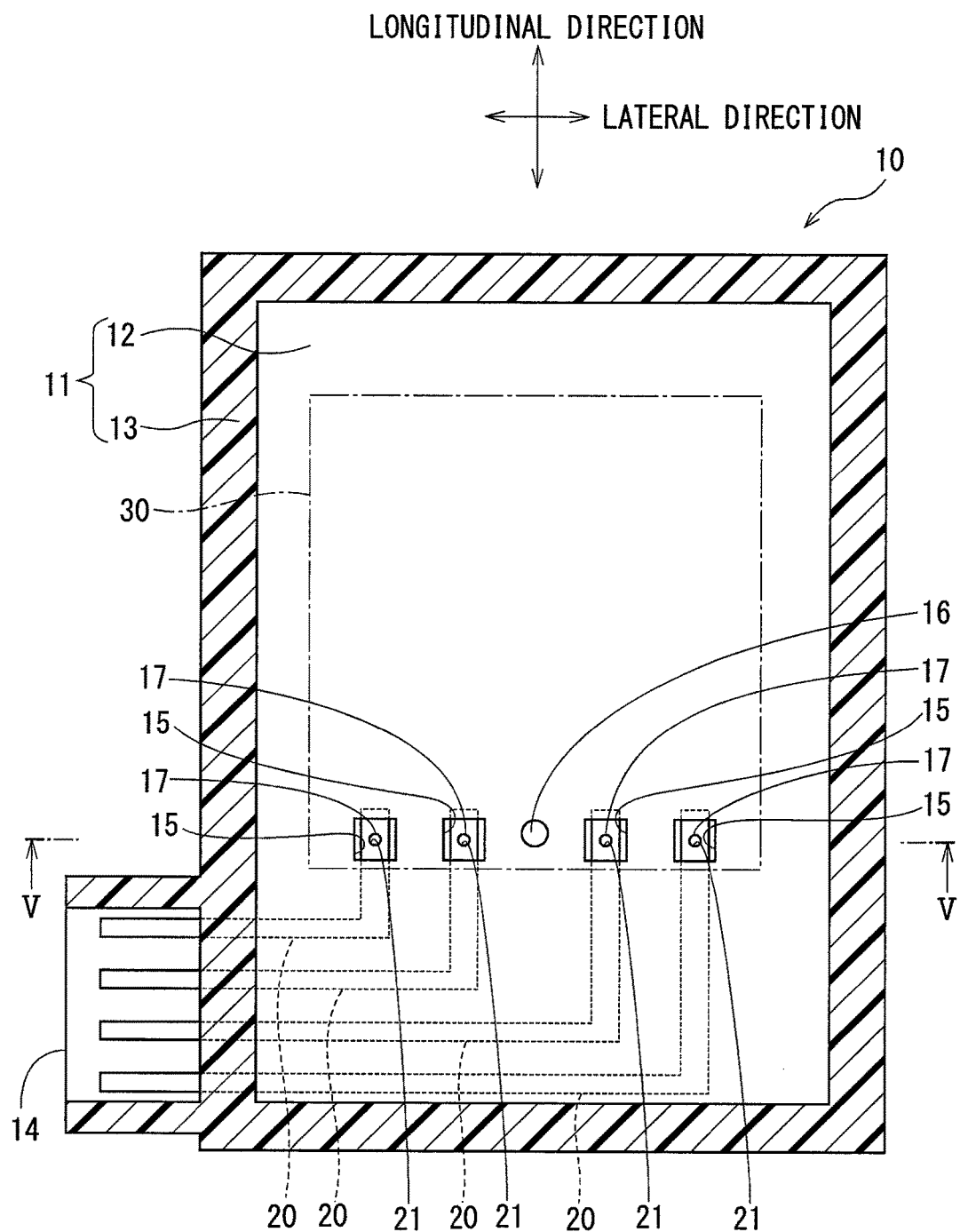
FIG. 4 is a cross-sectional diagram of an electronic device according to a second embodiment.
Figure 5:
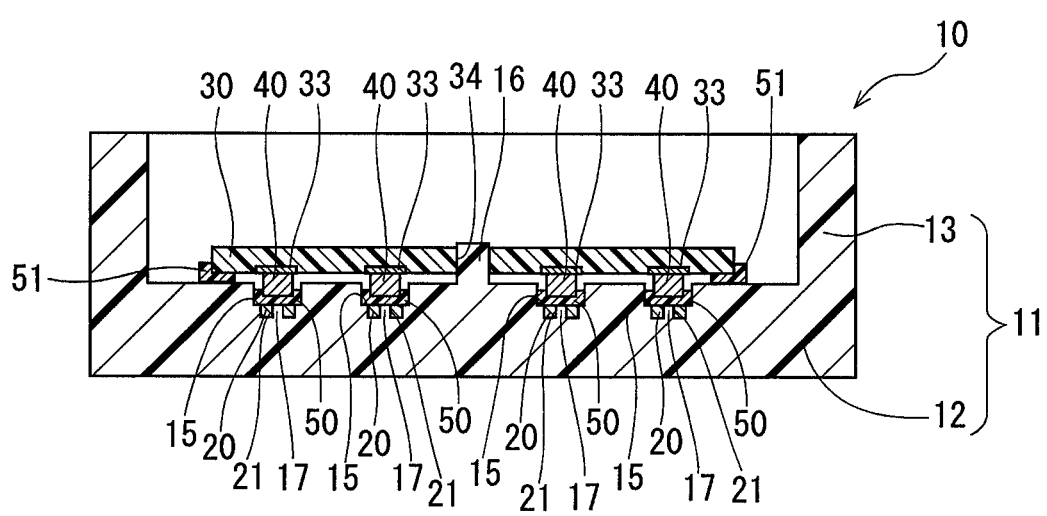
FIG. 5 is a cross-sectional diagram taken along V-V line in FIG. 4.

Next, the second embodiment will be described below with reference to FIGS. 4 and 5. In FIG. 4, the substrate 30 is eliminated and its outer circumference is indicated by the one-dot line for explanation purpose only. The electronic device 10 of the second embodiment includes a plurality of terminal positioning pins 17 in the recessed portions 15 of the sensor cover 11. The terminal positioning pins 17 are integrally formed with the sensor cover 11 and extend from the sensor cover 11 to be fit into terminal holes 21 of the terminal 20. Therefore, each of the sensor cover 11 and the terminals 20 increases and decreases the volume thereof through thermal expansion and thermal contraction with respect to the terminal positioning pin 17. Thus, stress applied to the conductive adhesives 50 can be reduced.

In the second embodiment, the sensor cover 11, the substrate positioning pin 16, and the terminal positioning pins 17 are integrally, continuously formed with each other. The substrate positioning pin 16 is fit into the substrate hole 34, and the terminal positioning pins 17 are fit into the terminal holes 21. Therefore, the positional deviation between the sensor cover 11, the substrate 30, and the terminal 20 can be prevented. As a result, stress applied to the conductive adhesives 50 can be reduced, and thus reliability of electric connection can be enhanced.

Other Embodiments

In the above-described embodiments, the electronic device 10 that detects a rotational angle of the throttle valve 2 of the electronic control throttle 1 is described. On the contrary, the electronic device 10 may be applied to a variety of devices other than the electronic control throttle 1.

In the above-described embodiments, the connecting portions between the plurality of terminals 20 and the plurality of the electric connectors 40 are arranged along the lateral direction of the sensor cover 11. In contrast, the connecting portions between the plurality of terminals 20 and the plurality of the electric connectors 40 may be arranged along the longitudinal direction of the sensor cover 11.

In the above-described embodiments, the sensor cover 11 and the substrate 30 are fixed to each other by the adhesives 51. Alternatively, the sensor cover 11 and the substrate 30 are fixed to each other by, e.g., a bolt.

What is claimed is:

1. An electronic device comprising:
   a casing;
   a terminal fixed to the casing;
   a substrate attached to the casing at a position where at least a portion of the substrate faces the terminal;
   an electric connector fixed to a circuit wiring formed in the substrate at a position where the substrate faces the terminal, the electric connector protruding toward the terminal from the circuit wiring; and
   a conductive adhesive interposed between the terminal and the electric connector, the conductive adhesive electrically and mechanically connecting the terminal to the electric connector.

2. The electronic device according to claim 1, wherein
   the casing defines a recessed portion at a position where the terminal is connected to the electric connector,
   the terminal extends to reach a bottom of the recessed portion of the casing, and
   the electric connector protrudes into the recessed portion from the circuit wiring of the substrate.

3. The electronic device according to claim 1, wherein the substrate is fixed to the casing by an adhesive.

4. The electronic device according to claim 1, wherein
   the electric connector includes a plurality of electric connectors,
   the electronic device further includes a substrate positioning pin disposed between two of the plurality of electric connectors that are adjacent to each other, and
   the substrate positioning pin protrudes from the casing to be fit into a substrate hole that is defined in the substrate.

5. The electronic device according to claim 1, further comprising:
   a terminal positioning pin disposed at a position where the terminal is connected to the electric connector by the conductive adhesive, wherein
   the terminal positioning pin protrudes from the casing to be fit into a terminal hole defined in the terminal.

6. An electronic device comprising:
   a casing;
   a terminal fixed to the casing;
   a substrate attached to the casing at a position where at least a portion of the substrate faces the terminal;
   an electric connector fixed to a circuit wiring formed in the substrate at a position where the substrate faces the terminal, the electric connector protruding toward the terminal from the circuit wiring; and
   a conductive adhesive electrically and mechanically connecting the terminal to the electric connector, wherein
   the casing defines a recessed portion at a position where the terminal is connected to the electric connector,
   the terminal extends to reach a bottom of the recessed portion of the casing, and
   the electric connector protrudes into the recessed portion from the circuit wiring of the substrate.

7. An electronic device comprising:
   a casing;
   a terminal fixed to the casing;
   a substrate attached to the casing at a position where at least a portion of the substrate faces the terminal;
   an electric connector fixed to a circuit wiring formed in the substrate at a position where the substrate faces the terminal, the electric connector protruding toward the terminal from the circuit wiring; and
   a conductive adhesive electrically and mechanically connecting the terminal to the electric connector, wherein
   the electric connector includes a plurality of electric connectors,
   the electronic device further includes a substrate positioning pin disposed between two of the plurality of electric connectors that are adjacent to each other, and
   the substrate positioning pin protrudes from the casing to be fit into a substrate hole that is defined in the substrate.

* * * * *